United States Patent

Latasiewicz et al.

[11] 4,076,165
[45] Feb. 28, 1978

[54] MOUNTING ARRANGEMENT FOR CHASSIS AND PRINTED CIRCUIT BOARD WITH METHOD OF ASSEMBLY

[75] Inventors: Leonard Latasiewicz, Hoffman Estates; Peter Franklin Stultz, Des Plaines, both of Ill.

[73] Assignee: Motorola, Inc., Schaumburg, Ill.

[21] Appl. No.: 692,615

[22] Filed: Jun. 3, 1976

[51] Int. Cl.² .............................................. H01L 3/34
[52] U.S. Cl. .................................... 228/136; 228/101; 228/170; 228/180 R
[58] Field of Search .................... 228/101, 170, 180 R, 228/223, 136; 317/101 C, 101 CC; 29/626, 513

[56] References Cited

U.S. PATENT DOCUMENTS

| 2,722,625 | 11/1955 | Bingeman et al. | 29/513 X |
| 2,762,987 | 9/1956 | Mackey | 317/101 C X |
| 2,898,518 | 8/1959 | Lynn | 317/101 CC |
| 3,407,261 | 10/1968 | Donath et al. | 317/101 CC X |
| 3,973,322 | 8/1976 | Boynton et al. | 29/626 |

FOREIGN PATENT DOCUMENTS

| 1,195,829 | 7/1965 | Germany | 317/101 DH |

*Primary Examiner*—Donald G. Kelly
*Assistant Examiner*—K. J. Ramsey
*Attorney, Agent, or Firm*—Margaret Marsh Parker; James W. Gillman

[57] ABSTRACT

An improved mounting arrangement and method of assembly provides for mounting parts on both chassis and board, then mating the two before soldering by means of a twist-tab-and-slot arrangement. The conformation and dimensions of the tab and slot prevent warpage during soldering, enabling the use of the chassis as a board carrier in the wave soldering process.

4 Claims, 5 Drawing Figures

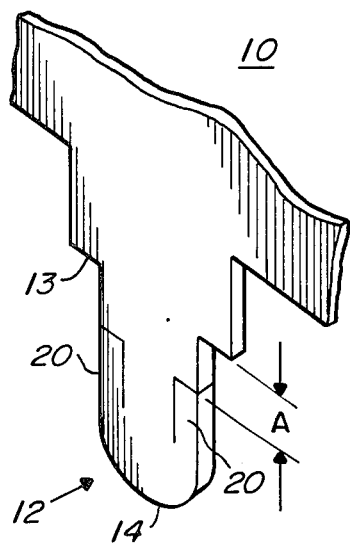
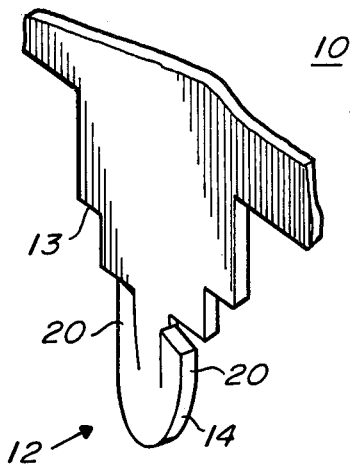
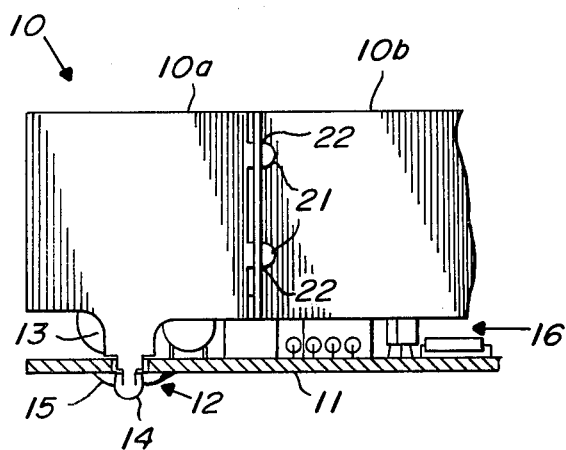
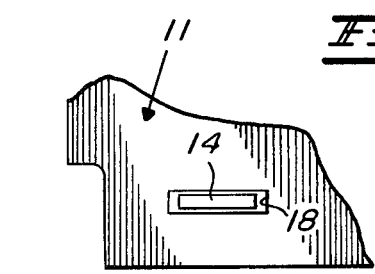
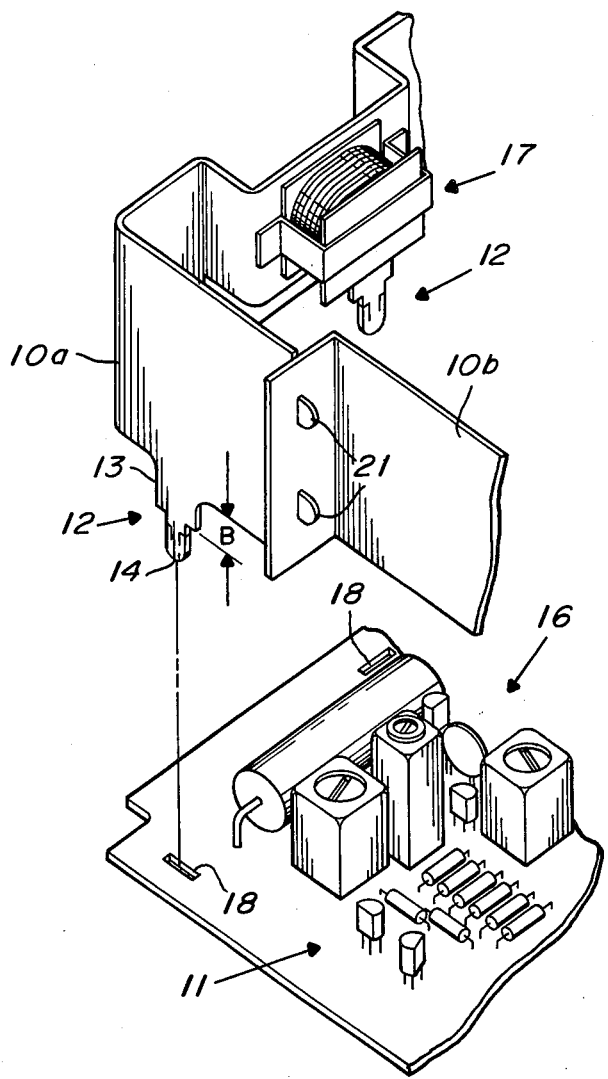

MOUNTING ARRANGEMENT FOR CHASSIS AND PRINTED CIRCUIT BOARD WITH METHOD OF ASSEMBLY

BACKGROUND OF THE INVENTION

This invention relates to the field of electronic apparatus assembly and specifically to an arrangement for mounting a printed circuit board to a chassis, then using the chassis as a board carrier during the waveline soldering process.

Increased automation of production lines has been a continuing goal in the electronics industry for some years. New impetus was added as components were miniaturized and new soldering methods were developed to eliminate hand soldering of each small component. It is known in the art to insert component leads into holes in an insulating board having most or all of its interconnections plated or printed on the board. The board is then fastened to a carrier or pallet which carries the board through the fluxing, soldering and cleaning steps on the production line. After these steps, the pallet is removed, the chassis fastened to the board and other components added and hand soldered. The use of pallets is costly for several reasons: relatively high original cost coupled with relatively short life, and the time and cost of labor required to attach, remove, clean, then move the pallets back to the point of attachment. Pallets continued to be used, however, since any known method of attaching the chassis to the printed circuit board before the soldering process would cause the board to warp due to the heat and stress. This warping frequently caused failures in the apparatus during testing or in use, due to minute cracks in the printed leads or loosened connections.

SUMMARY OF THE INVENTION

It is an object of the invention, therefore, to provide an improved mounting arrangement for a chassis and printed circuit board and a method of utilizing the arrangement.

It is a particular object to provide a mounting arrangement which will eliminate steps in the assembly process while at the same time improving the quality of the finished product.

The above objects are achieved in the present invention by the combination of printed circuit board slots and chassis parts which are shaped and dimensioned to (1) allow the chassis to be loosely attached to the printed circuit board before waveline soldering; (2) allow the chassis to function as a board carrier during the soldering process; and (3) prevent warpage of the board due to heating under stress.

BRIEF DESCRIPTION OF THE DRAWING

FIG. 1 is an elevational view of a portion of a chassis and printed circuit board mounting arrangement constructed according to the invention.

FIG. 2 is a perspective, exploded, partial view of the mounting arrangement of FIG. 1.

FIG. 3 is a bottom view of a portion of the board of FIG. 1 including one section of the mounting arrangement and showing the relative sizes of the tab and the printed circuit board slot.

FIG. 4a is an enlarged perspective view of the mounting tab before twisting.

FIG. 4b is the tab of FIG. 4a after twisting.

DETAILED DESCRIPTION OF THE PREFERRED EMBODIMENT

The mounting arrangement of the invention will be best understood in relation to the drawing in which like reference numerals are used throughout to indicate like parts. In FIG. 1 a side view of a chassis 10 and a printed circuit board 11 are shown as constructed, assembled and soldered according to the invention. The chassis 10 itself may be constructed in two parts 10a and 10b as will be described later. A tab, designated generally as 12 and having a shoulder portion 13 and a narrowed tab portion 14, has been inserted through the printed circuit board 11 and soldered (as at 15). It should be noted that, while one specified tab design is shown and described, other tab designs having the required characteristics could be used within the scope of the invention. These characteristics will be further described in relation to FIGS. 4a and 4b.

In FIG. 2, the mounting arrangement is shown prior to mating of the chassis 10 and the board 11 and the soldering step. The top surface of the board 11 supports a number of components 16, the leads of which have been inserted in apertures in the board. The board has been passed over a waveline waxer (not shown) to hold the leads of the components 16 in place, and over a cutter (not shown) to trim the component leads. All parts 17 (one shown) to be supported by the chassis 10 have been mounted and the chassis is ready to affix to the printed circuit board 11. The tabs 12 of the chassis 10 are then inserted in a like number of slots 18 in the printed circuit board. The slots 18 are positioned and dimensioned to provide a loose fit for the narrow portions 14 of the tabs 12.

In FIG. 3, the relative sizes of the narrow tab portion 14 and the slot 18 are indicated. In FIGS. 4a and 4b the details of the tabs 12 are shown before and after twisting of the end of the tab. After the chassis tabs 12 have been inserted in the printed circuit board 11, the ends of the tabs are twisted, preferably simultaneously and by machine for better control. The chassis 10 is held firmly during the twisting step but, because of the sizes of the tabs 12 and the slots 18, and the fact that the dimension "A" (FIG. 4a) is larger than the thickness of the printed circuit board material, no stress is applied to the board 11. Thus, the board is firmly retained by the twisted tabs 12, but has some mobility remaining in the plane of the board. Interconnections between board and chassis are then made and the chassis is gripped by a carrier (not shown) by means of the cut-away portions (indicated by dimension "B") of the chassis. Other means would be suitable for gripping the chassis according to the invention, but the cut-away portions "B" as shown are preferred for two reasons. First, is the simplicity and low cost of forming the cut-away portions "B" as the chassis portions are cut and formed. Second, is the fact that the cut-away portions "B" free valuable space on the printed circuit board 11 for placement of parts.

After twisting the end portions of the tabs 12, the small portions 20, the ends of which are now broken free, support but do not exert pressure on the board 11. As mentioned hereinbefore, the dimension "A" and the dimensions of the slot 18 allow sufficient room for the board to move slightly in the plane of the board. Additionally, in contrast to the type of twist tab (not shown) which is cut to provide a narrow or neck portion which twists within the slot, or an uncut tab 21 (FIGS. 1 and 2) such as may be used to hold the chassis portions together, the portion of the tab 12 which twists is outside the slot 18 and cannot cause binding pressure or stress on the printed circuit board material. As mentioned before, other tab designs having the above-described, non-binding characteristics, may be used in the present invention.

Production steps relating to the method of applying the invention are not illustrated since their structure is not critical to the invention. The printed circuit board 11 is fabricated with apertures and plated areas as is well known in the art. The leads of the small components 16 are inserted in the small apertures in the board and the board is then fluxed to prepare the appropriate areas to be soldered. The board then passes over a wave of wax which covers the bottom side of the board and holds the component leads firmly in place. This step also eliminates the necessity of a cleaning step in the assembly. In the next step, the board passes over a cutter which removes excess lead lengths. Meanwhile, all components to be directly supported by the chassis 10 are mounted on the chassis walls. The chassis 10 is preferably made in two portions 10a and 10b which may be fastened together by the twist tabs 21 and an appropriate number of slots 22 (FIGS. 1 and 2) either before or after (preferably before) the chassis is attached to the printed circuit board. After the mating of the chassis 10 and the printed circuit board 11 is completed by the twisting of the ends of the tabs 12, electrical interconnections are made. The chassis is then picked up via the cut-away portions "B" by a carrier attached to a conveyor and propelled through the remaining assembly steps. The chassis and board may be subjected to another fluxing step to prepare the chassis-to-board interconnections for soldering. The next steps take the units through a preheater which helps to prevent warping and the waveline soldering process which washes the bottom of the board and the apertures with molden solder. The unit is essentially ready for testing at this point.

Briefly then, the invention comprises attaching a chassis to a printed circuit board in such a fashion that the combined unit can be conveyed through the soldering process without the use of a separate pallet, while achieving higher reliability in the finished product. Modifications and variations may be made while remaining within the spirit and scope of the appended claims.

We claim:

1. A method of attaching an insulated circuit board to a metal chassis and carrying the combination on a conveyor mechanism, comprising the steps of:
   forming a plurality of apertures in the circuit board;
   providing solder receptive areas adjacent each circuit board aperture;
   inserting component leads in certain ones of said board apertures;
   forming projections on an edge of the chassis, the projections having a shoulder portion adjacent the chassis edge and a body portion smaller in cross-section than said shoulder portion, said body portion having a twistable end portion;
   inserting the body portions of the chassis projections into certain other ones of the apertures in the circuit board;
   twisting the end portions of the chassis projections for loosely retaining the circuit board;
   conveying the chassis and circuit board in suspension for soldering;
   soldering the twisted end portions of the chassis projections and the component leads to the adjacent solder receptive areas on the circuit board.

2. A method as claimed in claim 1 including in addition steps of:
   waxing the bottom of the circuit board; and
   removing excess component lead lengths, said steps occurring prior to insertion of the chassis projections into the circuit board apertures.

3. A method as claimed in claim 2 and including in addition, prior to the waxing step, the step of fluxing the bottom of the circuit board.

4. A method as claimed in claim 1 and including prior to the soldering step the step of preheating the circuit board.

* * * * *